United States Patent
Yang et al.

(10) Patent No.: US 10,936,007 B2
(45) Date of Patent: Mar. 2, 2021

(54) HYBRID METHOD FOR HIGH-SPEED SERIAL LINK SKEW CALIBRATION

(71) Applicant: OmniVision Technologies, Inc., Santa Clara, CA (US)

(72) Inventors: Li Yang, Fremont, CA (US); Qingle Wu, Palo Alto, CA (US); Zhixiang Jiang, Shanghai (CN)

(73) Assignee: OmniVision Technologies, Inc., Santa Clara, CA (US)

(*) Notice: Subject to any disclaimer, the term of this patent is extended or adjusted under 35 U.S.C. 154(b) by 134 days.

(21) Appl. No.: 16/374,525

(22) Filed: Apr. 3, 2019

(65) Prior Publication Data

US 2020/0319666 A1   Oct. 8, 2020

(51) Int. Cl.
| | |
|---|---|
| *G06F 1/10* | (2006.01) |
| *G06F 1/08* | (2006.01) |
| *G06F 7/58* | (2006.01) |
| *H03K 19/21* | (2006.01) |

(52) U.S. Cl.
CPC .................. *G06F 1/10* (2013.01); *G06F 1/08* (2013.01); *G06F 7/582* (2013.01); *H03K 19/21* (2013.01)

(58) Field of Classification Search
CPC .. G06F 1/10; G06F 1/08; G06F 7/582; H03K 19/21
See application file for complete search history.

(56) References Cited

U.S. PATENT DOCUMENTS

| | | | | |
|---|---|---|---|---|
| 6,636,467 | B1* | 10/2003 | Taussig | G11B 27/24 369/47.3 |
| 2006/0203947 | A1* | 9/2006 | Willis | H04L 7/033 375/375 |
| 2013/0106439 | A1* | 5/2013 | Dahl | G01S 13/767 324/617 |

OTHER PUBLICATIONS

ROC (Taiwan) Patent Application No. 109109358—Taiwanese Notice of Allowance with Search Report, dated Nov. 25, 2020.

* cited by examiner

*Primary Examiner* — Stefan Stoynov
(74) *Attorney, Agent, or Firm* — Christensen O'Connor Johnson Kindness PLLC

(57) ABSTRACT

A method for reducing a clock-data skew in a serial interface. A clock signal and a data signal are received through the serial interface at first and second inputs of an exclusive OR (XOR) averaging (XOR-averaging) gate. An output of the XOR-averaging gate is determined and compared with a target value. At least one of a delay of the clock signal and a delay of the data signal is determined based on comparing the output of the XOR-averaging gate with the target value. A skew between the clock signal and the data signal is reduced by delaying at least one of the clock signal and the data signal.

27 Claims, 9 Drawing Sheets

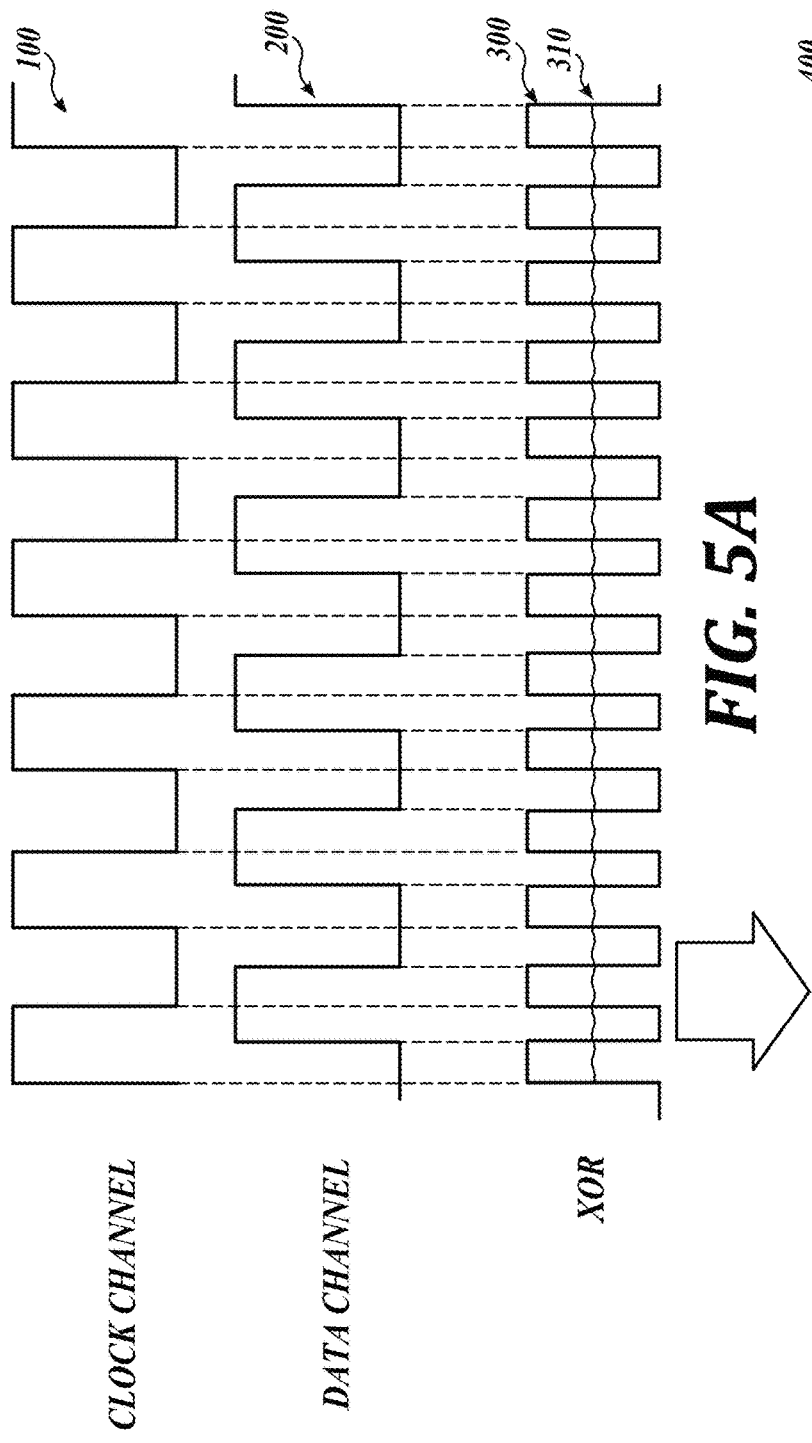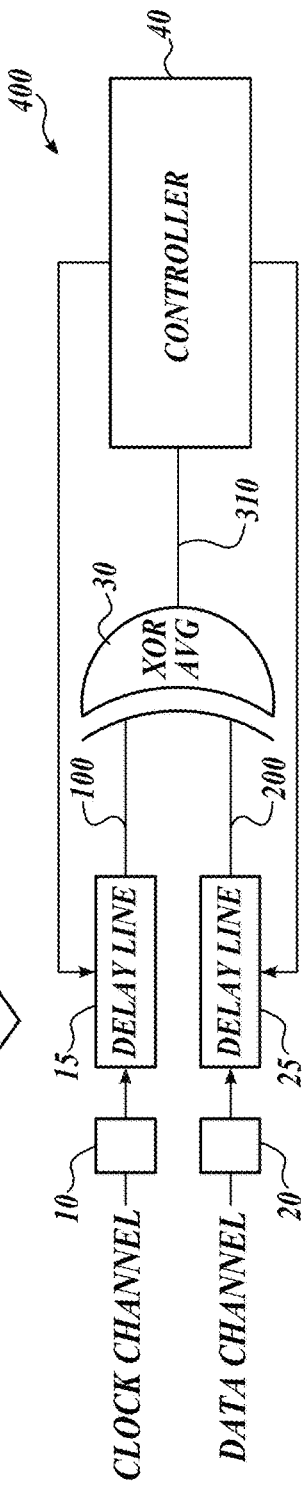
FIG. 5A
FIG. 5B

HYBRID METHOD FOR HIGH-SPEED SERIAL LINK SKEW CALIBRATION

BACKGROUND INFORMATION

Field of the Disclosure

This disclosure relates generally to skew calibration of high-speed serial interfaces, and in particular, but not exclusively, relates to high-speed serial interfaces conforming to the mobile industry processor interface (MIPI) standard.

Background

Image sensors have become ubiquitous. They are widely used in digital still cameras, cellular phones, security cameras, as well as medical, automobile, and other applications. The technology for manufacturing image sensors continues to advance at a great pace. For example, the demands for higher image sensor resolution and lower power consumption motivate further miniaturization and integration of image sensors into digital devices.

The increase in data bandwidth requirements has resulted in the development of different data transfer protocols that use higher data transfer rates. These higher data transfer rates, however, leave less time for the setup time and hold time during transfer of the digital data. For example, timing errors (also referred to as skew errors) that can be tolerated at lower data transfer rates may cause unacceptable levels of errors at higher data transfer rates. Therefore, systems and methods are needed for improved skew calibration (also referred to as deskewing) of the clock signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 5A is a timing diagram that shows deskewing between a clock signal and a data signal in accordance with an embodiment of the present technology.

FIG. 5B is a deskewing circuit in accordance with an embodiment of the present technology.

Figure 1:
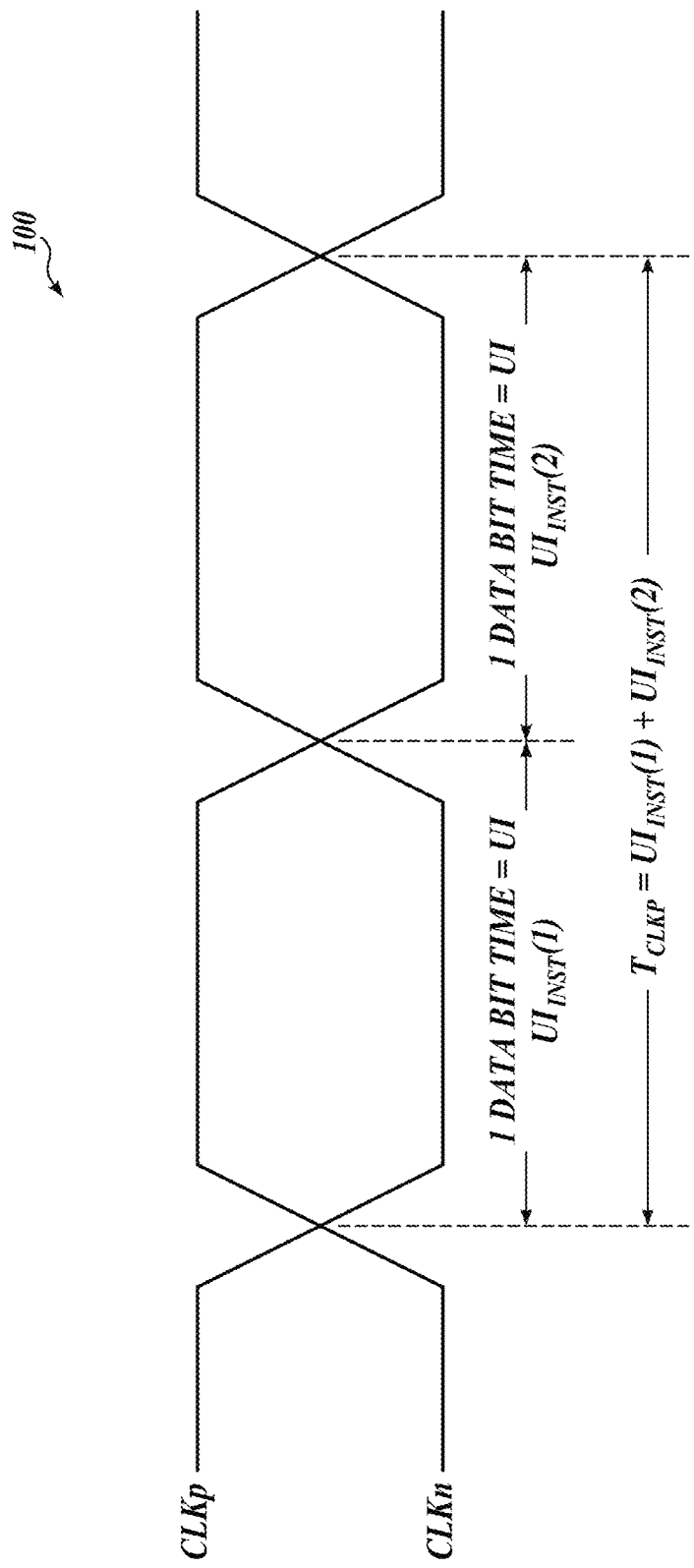
FIG. 1 is a timing diagram that shows a clock signal in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Methods and apparatuses for skew calibration of high-speed serial interfaces are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the inventive technology is directed to skew calibration (deskewing) of high-speed serial interfaces that transfer clock and data signals. In many high-speed serial interfaces, clock and data signals are transferred in different channels of the same physical layer (PHY). A non-limiting example of such high speed serial interface is a mobile industry processor interface (MIPI) D-PHY interface (also referred to as D-PHY link). Clock and data signals may be transferred in the same physical layer as two sinusoids that have the same frequency and are 90° out of phase (also referred to as "in-phase" or "quadrature" signals). By convention, one signal (e.g., clock) is a cosine waveform, and the other signal (e.g., data) is a sine waveform.

These serial interfaces are deskewed from time to time to reduce the effects of clock jitter and uneven arrival time of the clock signal at different points in the system. In general, deskewing includes determination of optimized phase offsets between the clock and data signals that minimize a timing mismatch that cause data errors.

As the data transfer rates become higher (e.g., 1.5 Gbps, 2.5 Gbps, or higher), the timing budgets become shorter for setup time ($T_{SETUP}$) before the data bit can be changed, and for hold time ($T_{HOLD}$) during which the data bit is not allowed to change. As a result, a minimization of clock skewing errors becomes more important if the data errors are to be reduced.

With some embodiments of the inventive technology, an initial deskewing is performed before transferring data frames between a transmitter (TX) and a receiver (RX). During the initial deskewing, a relatively large training sequence may be available for deskewing, for example, $2^{15}$ data bits (also referred to as unit intervals or UIs). Due to a relatively large size of this training sequence, a uniform sequence of 0 and 1 data bits may be used for the initial deskewing. However, a uniform sequence of 0 and 1 data bits may not be well suited for correcting inter-symbol-interference (ISI) errors within the available time between the image (frame) transmissions. This available time between the frame transmissions is also referred to as vertical blanking, and is generally shorter than the time available for the initial deskewing. For example, the available length of the data stream during the vertical blanking may be only about $2^{10}$ data bits. In some embodiments, a pseudorandom binary sequence (PRBS) with the statistically same likelihood of 0 and 1 data may be used for the deskewing during vertical blanking. In addition, a real image may be used for the deskewing if a link error is detected.

In some embodiments, a digital eye sweep may be used for deskewing in conjunction with the PRBS or real image data. For example, an opening window may be digitally adjusted (repositioned or digitally swept) within an eye diagram of the clock signal to optimize available $T_{SETUP}$ and $T_{HOLD}$ budget.

In different embodiments, deskewing is implemented using different circuits that adjust delay times at the receiver, either by adjusting a delay line of the clock channel or by adjusting a delay line of the data channel. In some embodiments, the adjustment of one of the delay lines (either clock delay or data delay) is sufficient for the deskewing between the clock and data channels.

To illustrate, FIG. 1 is a timing diagram that shows double data rate (DDR) clock signal 100 in accordance with an embodiment of the present technology. Illustrated differential clock signal 100 includes CLKp and CLKn signals. Clock signal 100 is divided into unit intervals (UIs), where each UI corresponds to one data bit. Therefore, the total period of the clock ($T_{CLKP}$) corresponds to two data bits of time. As a result, provided that the clock and data signals are properly deskewed, the value of the data signal may change up to twice during 1 period of the clock ($T_{CLKP}$).

Figure 2:
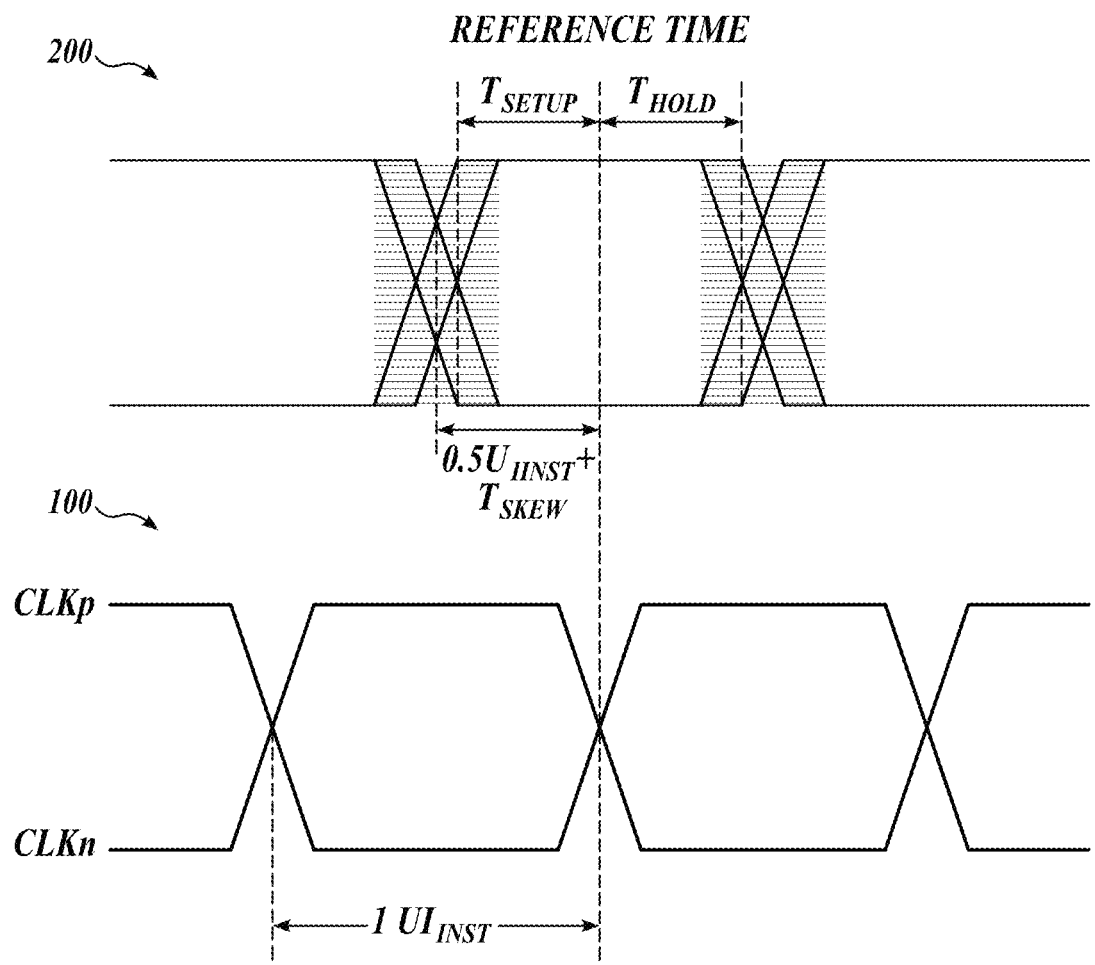
FIG. 2 is a timing diagram that shows a clock signal and a data signal in accordance with an embodiment of the present technology.

FIG. 2 is a timing diagram that shows clock signal 100 and data signal 200 in accordance with an embodiment of the present technology. The upper timing diagram shows data signal 200 and the lower diagram shows clock signal 100. For the data signal 200 to change its value from, for example 0 to 1, a $T_{SETUP}$ time should precede a change in the clock signal 100. Furthermore, a $T_{HOLD}$ time should follow the change in the clock signal 100 for the new data bit to become effective. The total time from the beginning to end of the change in data corresponds to 1 UI. The hatched area in the data signal 200 corresponds to a signal jitter, which is a signal variability of due to, for example, timing errors and noise in the signal. In general, jitter reduces the available budget for the $T_{SETUP}$ time and $T_{HOLD}$ time.

Figure 3:
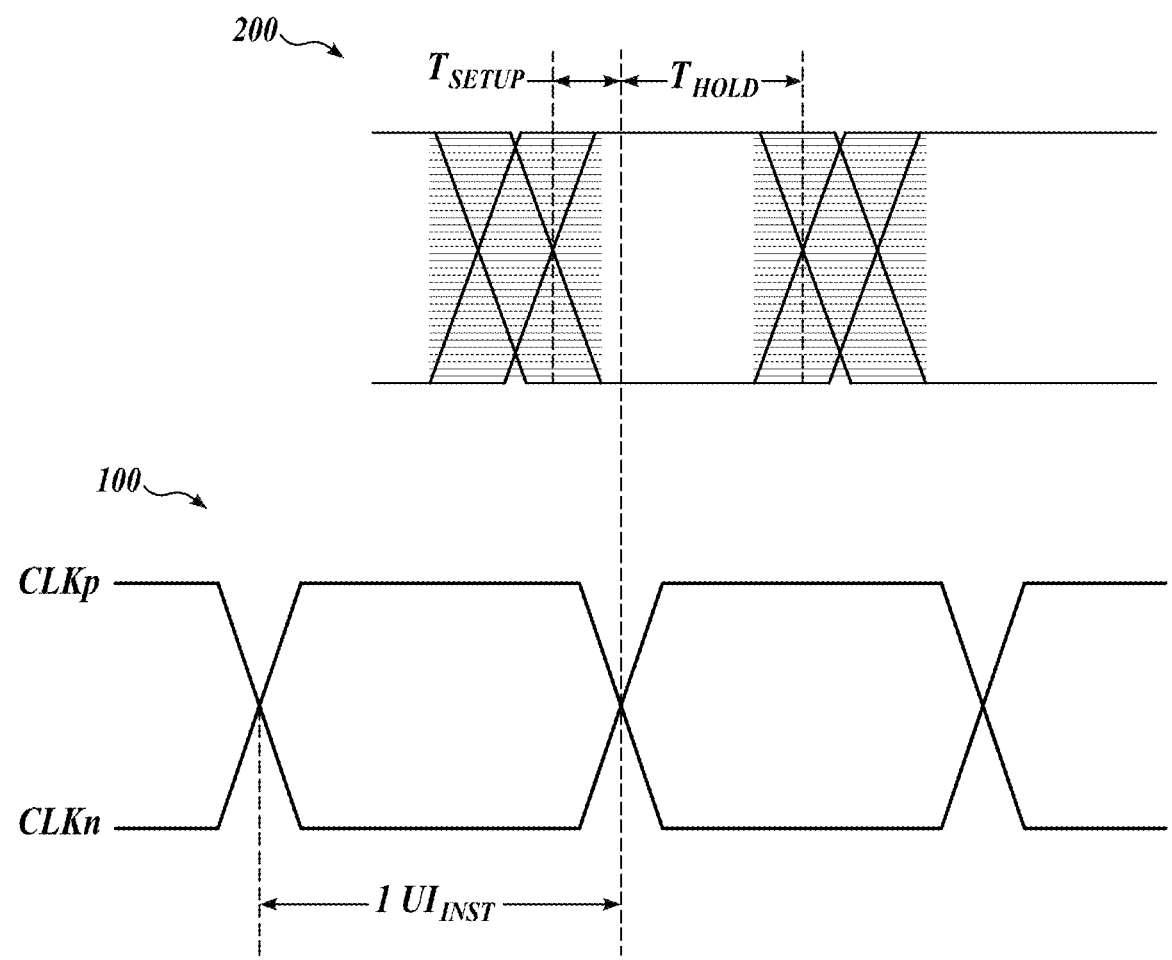
FIG. 3 is a timing diagram that shows a clock signal and a data signal with limited $T_{SETUP}$ and $T_{HOLD}$ budget in accordance with an embodiment of the present technology.

FIG. 3 is a timing diagram that shows clock signal and data signal with limited $T_{SETUP}$ and $T_{HOLD}$ budget in accordance with an embodiment of the present technology. Generally, an increased jitter reduces available budget for the $T_{SETUP}$ time and $T_{HOLD}$ time. Furthermore, clock signal 100 is skewed away from the middle of the illustrated transition in the data signal 200, therefore further reducing available $T_{SETUP}$ time. As a result, even a relatively small increase in jitter may make the budget for the $T_{SETUP}$ time and/or $T_{HOLD}$ time insufficient, triggering errors in data signal 200.

Figure 4:
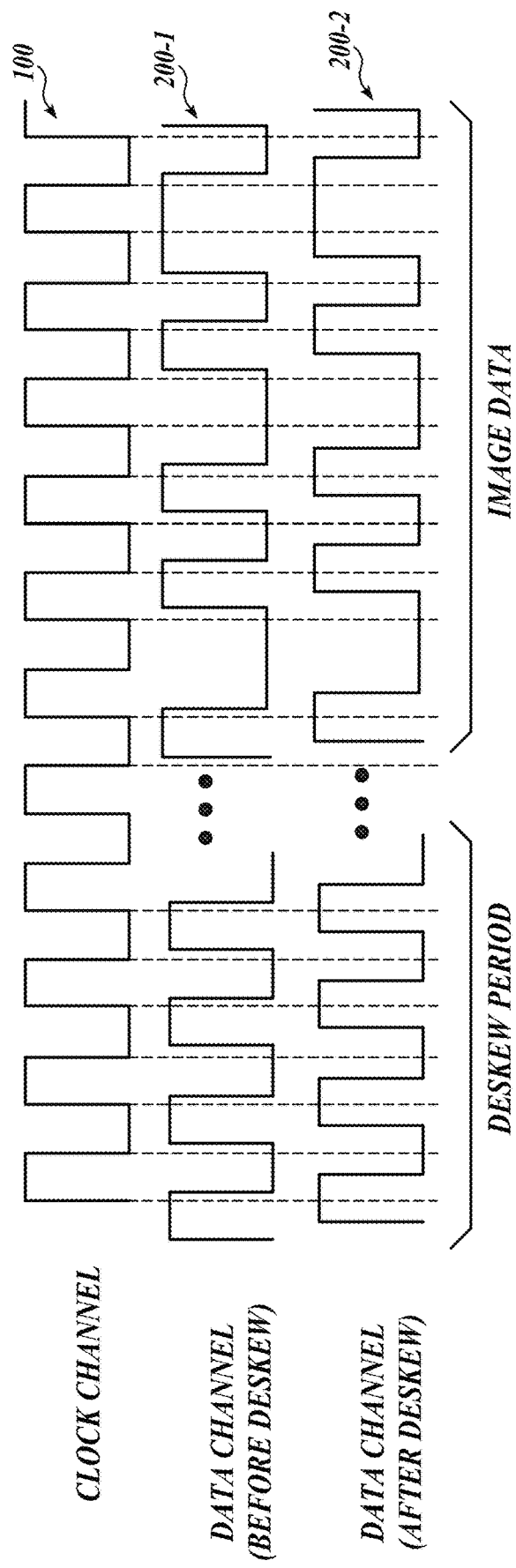
FIG. 4 is a timing diagram that shows deskewing between a clock signal and a data signal in accordance with an embodiment of the present technology.

FIG. 4 is a timing diagram that shows deskewing between a clock signal and a data signal in accordance with an embodiment of the present technology. The timing diagram illustrates clock channel 100, data channel 200-1 before deskewing, and data channel 200-2 after deskewing. The left-hand side of the illustrated timing diagram includes a deskew period during which deskewing of the data channel is performed with respect to the clock channel. The right-hand side of the timing diagram includes an image data period during which the data are transferred based, at least in part, on clock signal.

In the illustrated embodiment, deskewing of the data channel (also referred to as a data line) is performed with respect to the clock channel (also referred to as a clock line). However, in other embodiments the clock channel may be deskewed with respect to the data channel. In general, it is enough to deskew either the data channel or the clock channel to bring them into proper relative alignment. In some embodiments, both clock and data may be transferred over the same physical layer (e.g., the same pair of high-speed serial lines).

In the illustrated embodiment, prior to deskewing, data and clock signals are marginally aligned, possibly causing an increase in data transfer errors. However, after deskewing, data and clock signals are better aligned. Depending on the $T_{SETUP}$ time and $T_{HOLD}$ time, such better alignment after deskewing may correspond to the transition edge of the clock signal being aligned with a middle of the value 1 or value 0 of the data signal. In general, such an alignment provides better budgeting for the $T_{SETUP}$ time and $T_{HOLD}$ time, resulting in smaller number of data transfer errors. In different embodiments, other alignments are possible based on the values of $T_{SETUP}$ time and $T_{HOLD}$ time.

FIG. 5A is a timing diagram that shows deskewing between a clock signal and a data signal in accordance with an embodiment of the present technology. Illustrated timing diagram includes clock signal 100, data signal 200, and signal 310 that is obtained by applying an exclusive OR (XOR) averaging operation between clock signal 100 and data signal 200 during deskew period. In absence of the averaging operation, signal 300 would represent an XOR result of combining clock signal 100 and data signal 200. In some embodiments, deskewing between clock signal 100 and data signal 200 is performed with a goal of aligning the transition edge of the clock signal 100 with the middle of the data plateau (0 or 1) of the data channel 200. In some embodiments, such deskewing may be defined as an XOR-averaging function between clock signal 100 and data signal 200 having a desired average of 0.5, meaning that the transition edge of the clock signal 100 is statistically aligned with the middle of the data plateau (0 or 1) of the data channel 200. In some embodiments, such deskewing may be accomplished using a circuit illustrated in FIG. 5B.

FIG. 5B is a deskewing circuit in accordance with an embodiment of the present technology. Illustrated circuit may be part of the receiver (RX) 400. In some embodiments, clock signal 100 and data signal 200 are transferred through high-speed serial data channels 10 and 20 as inputs for an XOR-averaging element 30. The element 30 combines XOR function and averaging function. By combining these elements, the high-frequency output of XOR function is avoided, thus preserving circuit bandwidth and saving power. In some embodiments, element 30 may be a current-mode XOR element combined with a low-pass current-to-voltage converter.

Output of the XOR-averaging element 30 depends on the alignment of the clock channel 100 and data channel 200 shown in FIG. 5A. For example, if the high values (1's) of the data channel 200 are perfectly aligned with high values (1's) of the clock channel 100, the output of the XOR-averaging element 30 will be uniformly 0. At the other extreme of such hypothetical alignment between the clock channel and data channel, if the high values (1's) of the data channel 200 are perfectly aligned with low values (0's) of the clock channel 100, the output of the XOR-averaging element 30 will be uniformly 1. When, however, the transition edge of the clock signal 100 is statistically aligned with the middle of the data plateau (0 or 1) of the data channel 200, the resulting output of the XOR-averaging element 30 will be 0 half of the time and 1 half of the time, therefore statistically corresponding to 0.5 (i.e., 50% duty cycle) after being processed by the averaging element 30. For example, if the logical 0 corresponds to 0 V and the logical 1 corresponds to 1 V then the output of the XOR-averaging element 30 corresponds to 0.5 V.

The output of the XOR-averaging element 30 may be received by a controller or a processor 40 that includes suitable logic (e.g., firmware) for determining time delay in one or both of the delay lines 15 and 25. A person of ordinary skill would know how to implement delay lines using, for example, an inductor-capacitor library network or active circuit. In some embodiments, the controller 40 may implement the delay into the delay line 15 such that clock signal arriving at a serial link turn is further delayed in order to make the output of the averaging element 30 be as close to 0.5 as possible. As another example, the controller 40 may implement the delay into the delay line 25 such that data signal arriving at a serial link turn is further delayed in order to make the output of the averaging element 30 be another target value, for example, 0.7. In different embodiments, different target values of the output of the averaging element 30 are possible.

Figure 6A:
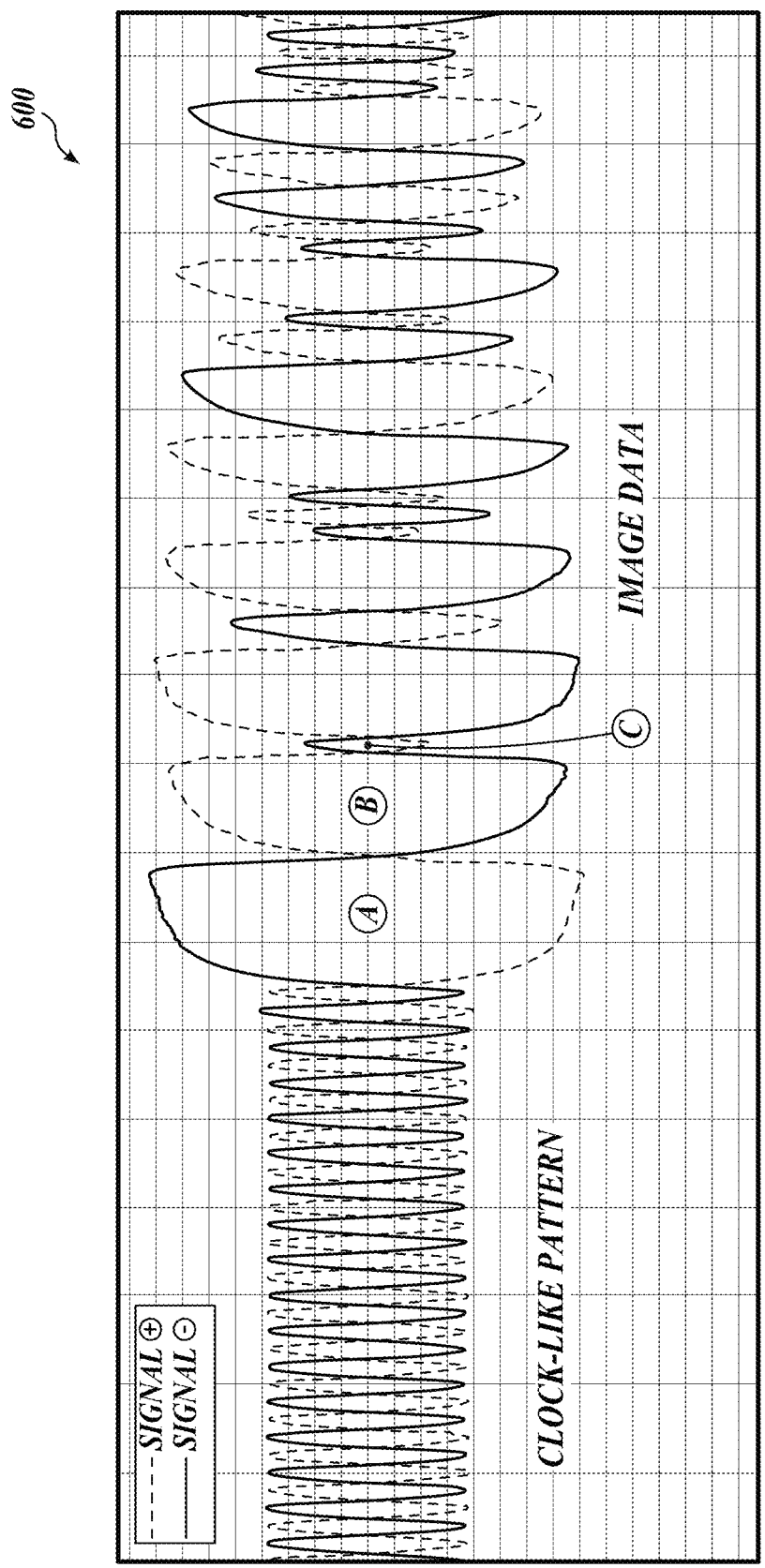
FIG. 6A is a timing diagram that shows deskewing using a pseudorandom binary sequence (PRBS) or real image data in accordance with embodiments of the present technology.

FIG. 6A is a timing diagram that shows deskewing using a pseudorandom binary sequence (PRBS) or real image data in accordance with embodiments of the present technology. In some embodiments, using a regular pattern of 0's and 1's for deskewing (as explained, for example, with reference to FIG. 5A) may not properly account for inter-symbol-interference (ISI), which is better accounted for with PRBS or with real image data. Furthermore, in some embodiments, deskewing based on PRBS may be especially suitable for the image blanking, that is, for the time periods between image frames.

FIG. 6A illustrates data patterns used for deskewing. The initial pattern is a clock-like pattern with a uniform sequence of logical 0's and 1's. In some embodiments, such a uniform sequence may be used for an initial deskewing, prior to transferring data frames. Next, PRBS data are used for deskewing. In some embodiments, such deskewing is referred to as alternate calibration. In the example shown in FIG. 6A, data block A may correspond to a symbol having a large number of logical 0's, data block B may correspond to a symbol having a large number of logical 1's, and data block C may correspond to a symbol having interspersed logical 0's and 1's. As a result, data blocks A and B have relatively large eye openings, while data block C has a relatively small opening making it more susceptible to skewing errors. In general, image data or PRBS data on the right-hand side of the graph includes relatively diverse combinations of symbols, thus providing deskewing data that a uniform sequence of logical 0's and 1's generally cannot provide.

Figure 6B:
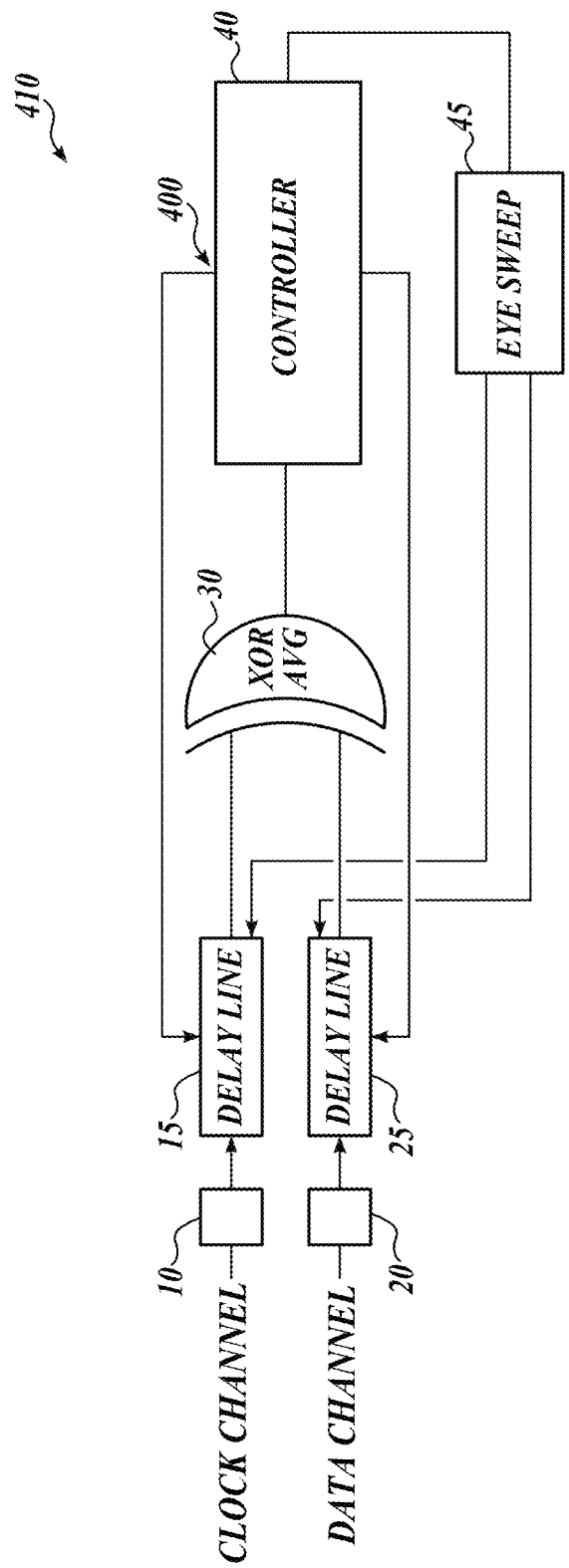
FIG. 6B is a deskewing circuit in accordance with an embodiment of the present technology.

FIG. 6B is a deskewing circuit 410 in accordance with an embodiment of the present technology. In some embodiments, the deskewing circuit 410 includes the RX 400 with an eye sweep element 45 that may be implemented as a digital element capable of digitally sweeping a combination of the $T_{SETUP}$ time and $T_{HOLD}$ time in order to optimally position $T_{SETUP}$ time and $T_{HOLD}$ time within an opening of the eye diagram. The person of ordinary skill would know how to implement such a digital sweep using, for example, digital controllers, processors, analog to digital (A/D) converters, and/or other elements. An example of such digital sweep is explained with reference to FIG. 7.

Figure 7:
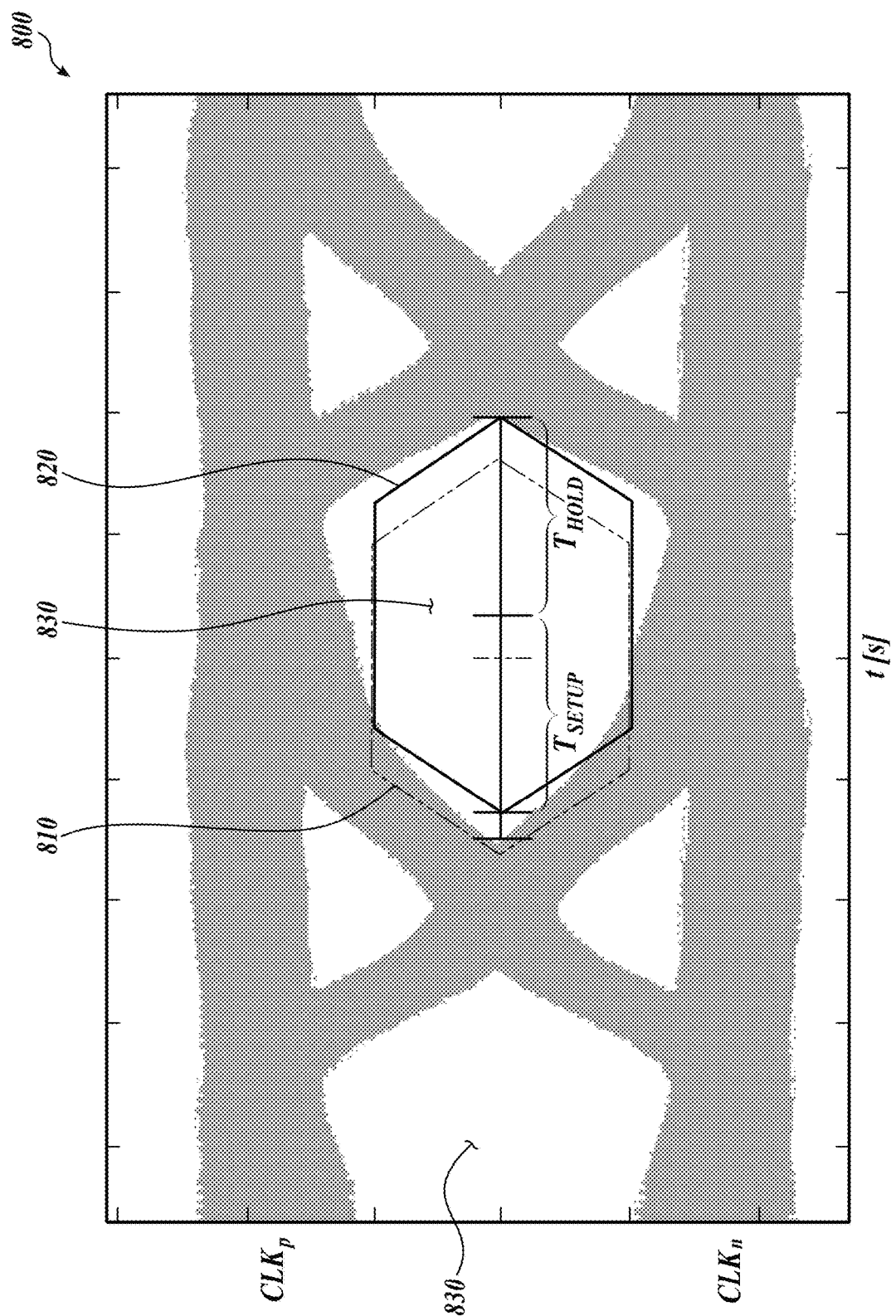
FIG. 7 is an eye diagram illustrating a digital eye sweep in accordance with an embodiment of the present technology.

FIG. 7 is an eye diagram illustrating a digital eye sweep in accordance with an embodiment of the present technology. FIG. 7 shows an eye diagram that is a composite picture of the clock jitter for a large number of cycles. In general, a larger size of the eye opening 830 corresponds to a larger budget for the combination of the $T_{SETUP}$ time and $T_{HOLD}$ time. In particular, the width of the eye opening 830 corresponds to the time budget, whereas the height of the eye-opening 830 corresponds to the voltage budget. In the illustrated graph 800, the available budget (before deskewing) for the $T_{SETUP}$ time and $T_{HOLD}$ time corresponds to a shape 810. After deskewing that, for example, uses the eye sweep 45 shown in FIG. 6B, the clock and data signals are deskewed such that the $T_{SETUP}$ time and $T_{HOLD}$ time are encompassed in the shape 820, which better utilizes the time/voltage budget of the eye opening 830 that the pre-deskewing shape 810.

Figure 8:
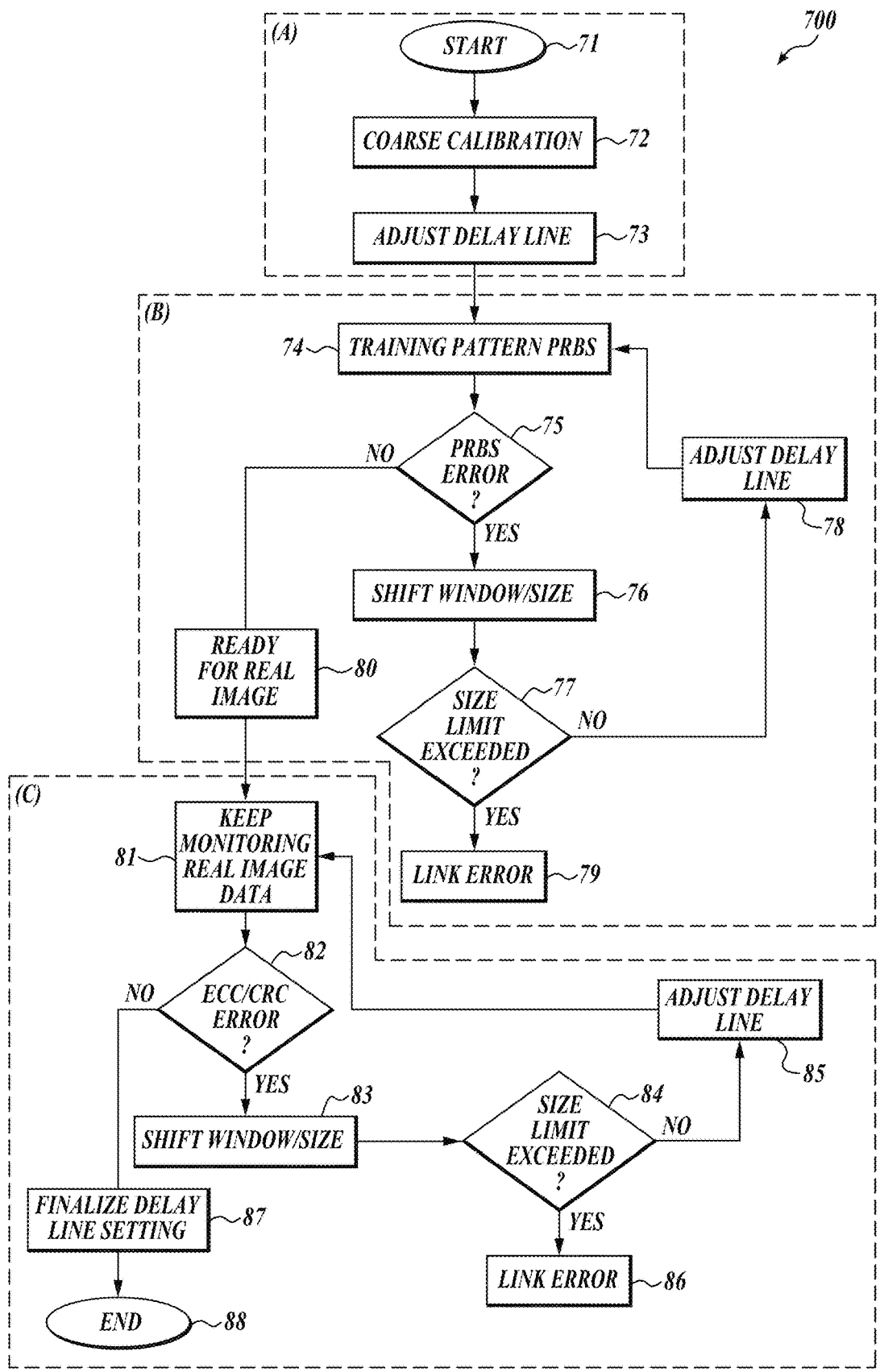
FIG. 8 is a flow chart illustrating a deskewing method in accordance with an embodiment of the present technology.

FIG. 8 is a flow chart illustrating a deskewing method 700 in accordance with an embodiment of the present technology. In some embodiments, the method may include only some of the steps in the flowchart, or may include additional steps that are not illustrated in the flowchart 700.

In some embodiments, block (A) may correspond to an initial deskewing using a uniform pattern of 0's and 1's, block (B) may correspond to a digital sweep with training pattern, and block (C) may correspond to a digital sweep with real image data. The method 700 starts at block 71, and proceeds to coarse calibration in block 72. In some embodiments such a coarse calibration may be executed using a uniform pattern of 0's and 1's, and the circuit shown in FIG. 5B. Block 73 indicates an adjustment of the delay line, for example, delay line 15 and/or 25 shown in FIG. 5B. Some embodiments, the coarse calibration of block (A) may correspond to an initial calibration before processing of the data frames.

Block (B) may start with supplying a PRBS training pattern in block 74. In some embodiments, the PRBS training pattern may be a PRBS9 training pattern. In block 75, a decision is made whether the PRBS training pattern has caused an error. If no error was caused by the PRBS training pattern, the method proceeds with a normal deskew process by making the system ready for monitoring real image data in block 80. If error was caused by the PRBS training pattern, the method proceeds to block 76 to shift the combination of the $T_{SETUP}$ time and $T_{HOLD}$ time (e.g., to shift shape 810 shown in FIG. 7).

Shifting of the combination of the $T_{SETUP}$ time and $T_{HOLD}$ time may be limited by the predetermined value of shifting time/voltage shape 810. In many embodiments, the deskewing process is sensitive to the incremental changes in the relative position of the clock signal and data signal, therefore the window shifting is limited to preserve stability of the method. Therefore, in block 77, a determination is made whether these shifting limits are exceeded. If they are, the method proceeds to block 79 to indicate an error and to stop the method. If, however, the window/size shifting of block 76 was within the allowed limits the method proceeds to block 78, where the delays of delay lines (e.g., delays of the delay lines 15 or 25) are adjusted. The method next proceeds to block 74 to repeat block (B) with another PRBS training pattern.

In some embodiments, block (C) may start at block 81 with a real image data. The method may proceed to block 82 where a determination is made as to whether the real image data result in skewing errors. Such determinations may include error checking code (ECC) and/or consecutive recycling corrections (CRC). If the real image data has caused skewing errors, the method proceeds to block 83 to shift the combination of the $T_{SETUP}$ time and $T_{HOLD}$ time (e.g., to shift the shape 810 shown in FIG. 7). In block 84, a determination is made whether the shifting limits are exceeded. If they are, the method proceeds to block 86 to indicate an error and to stop the method. If, however, the window/size shifting of block 83 is within the allowed limits the method proceeds to block 85 where the delays (e.g., the delay lines 15 or 25) are adjusted. Real image data is used again in block 81. If no errors are detected in block 82, the method proceeds to block 87 where line delays are finalized. The method may end in block 88.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method for reducing a clock-data skew in a serial interface, comprising:
   receiving a clock signal and a data signal through the serial interface at first and second inputs of an exclusive OR averaging (XOR-averaging) gate;
   producing an output of the XOR-averaging gate;
   comparing the output of the XOR-averaging gate with a target value;
   determining at least one of a delay of the clock signal and a delay of the data signal based on said comparing the output of the XOR-averaging gate with the target value; and
   reducing a skew between the clock signal and the data signal by delaying at least one of the clock signal and the data signal.

2. The method of claim 1, wherein the data signal comprises a repeating sequence of 0 and 1 data bits.

3. The method of claim 1, wherein the data signal comprises pseudo random binary sequence (PRBS) data bits, wherein the method further comprises:
   generating an eye diagram of the clock signal;
   determining a size of an opening window in the eye diagram; and
   comparing the size of the opening window with a sum of a setup time ($T_{SETUP}$) and a hold time ($T_{HOLD}$).

4. The method of claim 3, wherein said determining at least one of the delay of the clock signal and the delay of the data signal comprises aligning a center of the opening window with a middle point of the sum of $T_{SETUP}$ and $T_{HOLD}$.

5. The method of claim 4, wherein the PRBS data bits are PRBS9 data bits.

6. The method of claim 4, wherein the method is periodically executed during vertical blanking between frames of data.

7. The method of claim 1, wherein the data signal comprises image data, wherein the method further comprises:
   generating an eye diagram of the clock signal;
   determining a size of an opening window in the eye diagram; and
   comparing the size of the opening window with a sum of a setup time ($T_{SETUP}$) and a hold time ($T_{HOLD}$).

8. The method of claim 7, wherein said determining at least one of the delay of the clock signal and the delay of data signal comprises aligning a center of the opening window with a middle point of the sum of $T_{SETUP}$ and $T_{HOLD}$.

9. The method of claim 8, wherein the method is periodically executed during vertical blanking between frames of data.

10. The method of claim 1, wherein the XOR-averaging includes current-mode XOR element and averaging through a low-pass current to voltage converter.

11. The method of claim 1, wherein the target value for comparing the output of the XOR-averaging corresponds to a duty cycle of 50%.

12. The method of claim 1, wherein the clock signal and the data signal are transmitted in quadrature.

13. The method of claim 1, wherein said delaying at least one of the clock signal and the data signal comprises adjusting a phase difference between the clock signal and the data signal.

14. The method of claim 1, wherein the serial interface comprises a Mobile Industry Processor Interface (MIPI) serial link.

15. A system for reducing a clock-data skew in a serial interface, comprising:
   a receiver (RX) coupled to receive a clock signal and a data signal on the serial interface, wherein the RX comprises:
      an exclusive OR averaging (XOR-averaging) gate coupled to receive the clock signal and the data signal;

a controller coupled to the XOR-averaging gate, wherein the controller includes logic that when executed causes the controller to perform operations, including:
    determining an output of the XOR-averaging gate,
    comparing the output of the XOR-averaging gate with a target value, and
    determining at least one of a delay of the clock signal and a delay of the data signal based on comparing the output of the XOR-averaging gate with the target value; and
at least one of a delay line of the clock signal and a delay line of the data signal coupled to the controller and coupled to an input of the XOR-averaging gate.

16. The system of claim 15, wherein the XOR-averaging gate includes a low-pass current to voltage converter.

17. The system of claim 15, wherein the data signal comprises a repeating sequence of 0 and 1 data bits.

18. The system of claim 15, wherein the data signal comprises pseudo random binary sequence (PRBS) data bits, wherein the controller is further caused to perform operations including:
    determining a size of an opening window in an eye diagram; and
    comparing the size of the opening window with a sum of a setup time ($T_{SETUP}$) and a hold time ($T_{HOLD}$).

19. The system of claim 18, wherein said determining at least one of the delay of the clock signal delay and the delay of the data signal comprises aligning a center of the opening window with a middle point of the sum of $T_{SETUP}$ and $T_{HOLD}$.

20. The system of claim 18, wherein the PRBS data bits are PRBS9 data bits received by the RX during vertical blanking between frames of data.

21. The system of claim 15, wherein the data signal comprises image data, wherein the controller is further caused to perform operations including:
    determining a size of an opening window in an eye diagram;
    comparing the size of the opening window with a sum of a setup time ($T_{SETUP}$) and a hold time ($T_{HOLD}$).

22. The system of claim 21, wherein said determining at least one of the delay of the clock signal and the delay of the data signal comprises aligning a center of the opening window with a middle point of the sum of $T_{SETUP}$ and $T_{HOLD}$.

23. The system of claim 22, wherein the image data are received by the RX during vertical blanking between frames of data.

24. The system of claim 15, wherein the target value for comparing with the output of the XOR-averaging corresponds to a duty cycle of 50%.

25. The system of claim 15, wherein the clock signal and the data signal are transmitted in quadrature.

26. The system of claim 15, wherein the at least one of the delay line of the clock signal and the delay line of the data signal are coupled to adjust a phase difference between the clock signal and the data signal.

27. The system of claim 15, wherein the serial interface comprises a Mobile Industry Processor Interface (MIPI) serial link.

* * * * *